United States Patent [19]

Shah

[11] Patent Number: 4,503,341

[45] Date of Patent: Mar. 5, 1985

[54] POWER-DOWN INVERTER CIRCUIT

[75] Inventor: Ashwin H. Shah, Dallas, Tex.

[73] Assignee: Texas Instruments Incorporated, Dallas, Tex.

[21] Appl. No.: 528,319

[22] Filed: Aug. 31, 1983

[51] Int. Cl.³ ............... H03K 19/003; H03K 19/094
[52] U.S. Cl. .................................. 307/450; 307/443;
307/448; 307/468; 307/304; 365/227
[58] Field of Search ............... 307/443, 445, 448–450,
307/463–465, 468, 473, 572, 581, 584, 304;
365/226–227, 230

[56] References Cited

U.S. PATENT DOCUMENTS

| 3,775,693 | 11/1973 | Proebsting | 307/450 |
| 4,384,220 | 5/1983 | Segawa et al. | 307/581 X |
| 4,408,305 | 10/1983 | Kuo | 307/449 X |

Primary Examiner—Stanley D. Miller
Assistant Examiner—D. R. Hudspeth
Attorney, Agent, or Firm—Robert Groover, III; Melvin Sharp; James T. Comfort

[57] ABSTRACT

A power-down inverter comprising three devices in series between supply voltage VDD and ground. A depletion load transistor connects the power supply rail to a first output node; a natural-threshold-voltage transistor, whose gate is controlled by the power-up signal, connects the first output node to a second output node, and an enhancement mode transistor, whose gate is controlled by the input signal to the inverter, connects the second output node to ground. This circuit provides an output (at the first output node) which is never floating, and it is therefore not necessary to use complementary signals for the power-up information. Moreover, the provision of two output nodes permits multiple output states to be available during the power-down mode if desired, depending on the full circuit configuration.

6 Claims, 8 Drawing Figures

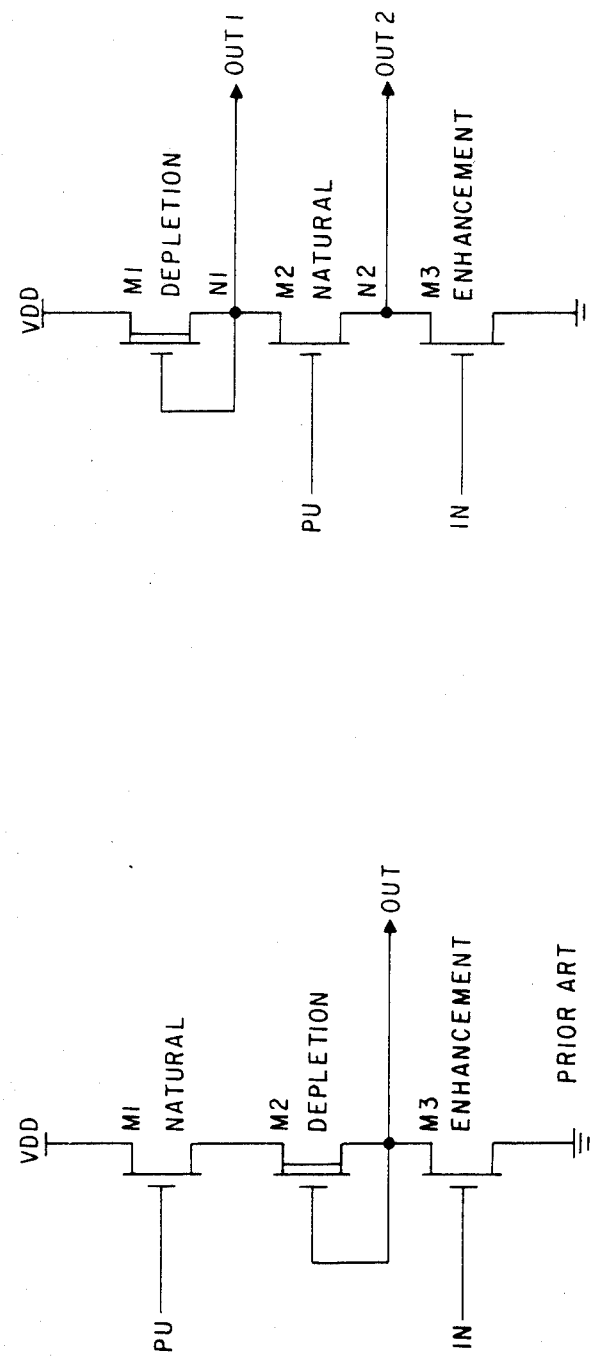

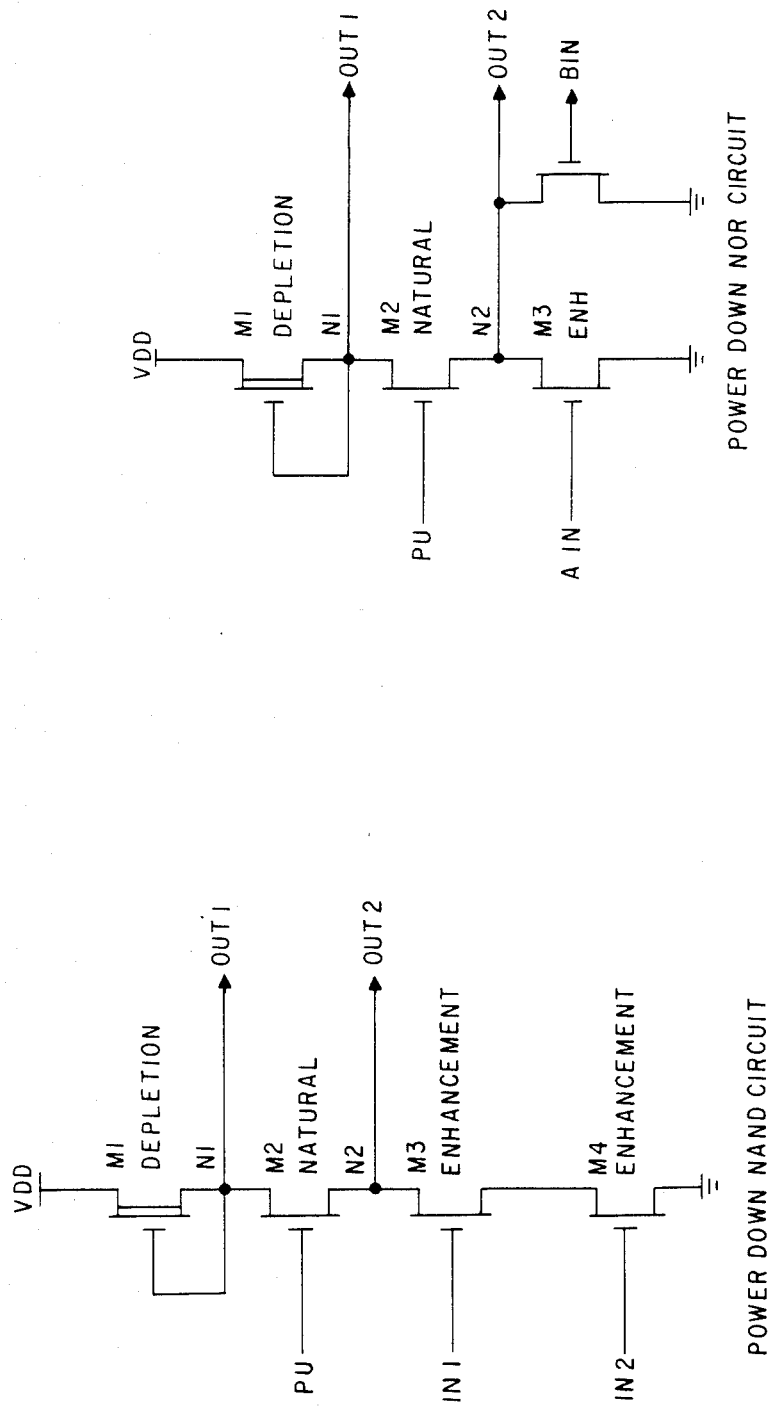

POWER-DOWN INVERTER CIRCUIT

BACKGROUND AND SUMMARY OF THE INVENTION

The present invention relates to integrated logic circuits, and particularly to logic circuits which include one or more inverter stages.

Power-down of static logic circuits is highly desirable in many applications, both for circuit reasons (average power per chip over a one-second window) and for system reasons (e.g., where a compact battery operated system is to be configured). However, prior art configurations of static logic circuits with power-down capability are not satisfactory. Presently, the power-down of a typical static circuit is implemented using the conventional three transistor inverter stack, as shown in FIG. 1a, as the basic circuit block. It is evident in FIG. 1a showing the conventional power-down inverter stack that this circuit has a unique output. This is so even though there are two different circuit nodes, as in the proposed configuration, because electrically they are always connected through a low impedance depletion type device.

The prior art circuit configuration shown in FIG. 1a has two important problems. First, when the power-up signal and the input signal are both low, the output node is floating. This means that, in a buffer circuit configured using such inverters, such as that shown in FIG. 2a, additional circuitry is required to prevent problems caused by this floating node. For example, in the circuit of FIG. 2a, the additional complementary input marked PU-bar and transistors MX1 and MX2, are required to eliminate deleterious effects of this floating node in the low-input power-down state.

Second, an additional difficulty of the prior art configuration is that a threshold voltage drop from the high rail exists during the on state. That is, when the IN signal is low, the OUT signal will not go all the way up to VCC, but will be less than VDD by 1 threshold voltage.

A further prior art power-down inverter circuit is as shown in FIG. 1c. In this case, the power-up transistor is connected directly to ground, the depletion-load transistor is connected to the power supply, and the third transistor controlled by the input signal is interposed between these other two transistors. This configuration is shown in FIG. 2A of U.S. Pat. No. 4,096,584, which is hereby incorporated by reference. It should be noted that both the power-up and input transistors are enhancement-mode transistors. This means that it may be difficult to pull the output all the way to ground, because of voltage drop across these transistors. This configuration has primarily been used as a NAND of two inputs and not as the power down circuit. Although a NAND configuration is not a novelty in itself, it has never been used for the purpose of saving the power in stand-by mode.

Thus it is an object of the present invention to provide a static power-down inverter which can pull its output node all the way up to supply voltage.

It is a further object of the present invention to provide a static power-down inverter which can pull its output node all the way up to supply voltage or down to within 0.2 volt of ground.

It is a further object of the present invention to provide a power-down buffer which requires only a single power-up signal, and does not require complementary power-up signals nor additional transistors to generate a complement to the power-up signal.

It is a further object of the present invention to provide a power-down buffer requiring only nine active devices, which provides true and complemented outputs but requires only an uncomplemented power-up signal and an uncomplemented input signal.

It is a further object of the invention to provide a power-down buffer requiring only nine active devices, which provides actively driven outputs even in a power-down condition.

According to the present invention, there is provided:

An inverter comprising:
  first, second, and third field effect transistors connected in series;
    said first transistor having a first source/drain terminal connected to a power supply, and also a second source/drain terminal and a gate connected together;
    said second transistor having a first source/drain terminal connected to said second source/drain terminal of said first transistor, and also having a seond source/drain terminal, and also having a gate connected to receive a power-up signal;
    said third transistor having a first source/drain terminal connected to said second source/drain terminal of said second transistor, and also having a second source/drain terminal connected to a second supply voltage, and also having a gate connected to receive an input signal;
  said second source/drain terminal of said first transistor providing a first output node of said circuit; and
  said second source/drain terminal of said second transistor providing a second output node of said circuit.

According to the present invention there is provided:
An inverter comprising:
  a first field-effect transistor, consisting of a depletion-load transistor, connected between said power supply and a first output node;
  second and third field-effect transistors, said second and third transistors being connected in series between said first output node and ground, said second transistor comprising a gate controlled by an input signal and said third transistor comprising a gate controlled by a power-up signal;
  wherein at least one of said second and third transistors has a threshold voltage in the range from 0 to 0.4 volts.

According to the present invention there is provided:
A buffer circuit comprising:
  first, second, and third inverters, each inverter comprising:
    first, second, and third field effect transistors connected in series; said first transistor having a first source/drain terminal connected to a power supply and a second source/drain terminal connected to a gate thereof;
    said second transistor having a first source/drain terminal connected to said second source/drain terminal of said first transistor, and also having a second source/drain terminal, and also having a gate connected to receive a power-up signal;
    said third transistor having a first source/drain terminal connected to said second source/drain terminal of said second transistor, and also having a second source/drain terminal connected to a second supply voltage, and also having a gate connected to receive an input signal;

said second source/drain terminal of said first transistor providing a first output node of said circuit; and said second source/drain terminal of said second transistor providing a second output node of said circuit;

said first inverter being connected to receive an external input, said gate of said third transistor of said second inverter being connected to said first output node of said first inverter, and said gate of said third transistor of said third inverter being connected to said first output node of said second inverter;

said second output node of said second inverter and said second output node of said third inverter being connected to provide complementary buffer output signals.

According to the present invention, there is provided:

A buffer circuit comprising:

first, second, and third inverters, each inverter comprising:

a first field-effect transistor, consisting of a depletion-load transistor, connected between said power supply and a first output node;

second and third field-effect transistors, said second and third transistors being connected in series between said first output node and ground, said second transistor comprising a gate controlled by an input signal and said third transistor comprising a gate controlled by a power-up signal;

wherein at least one of said second and third transistors has a threshold voltage in the range from 0 to 0.4 volts.

BRIEF DESCRIPTION OF THE DRAWINGS

The present invention will be described with reference to the accompanying drawings, which are hereby expressly incorporated by reference into the specification of the present application, including:

FIGS. 1a and 1c show prior art static power-down inverter configurations, and FIG. 1b shows a static power-down inverter configuration according to the present invention;

FIGS. 4 and 5 show a NAND gate and a NOR gate respectively, both comprising power-down capability according to the present invention.

DETAILED DESCRIPTION OF THE PREFERRED EMBODIMENTS

Figure 1C:
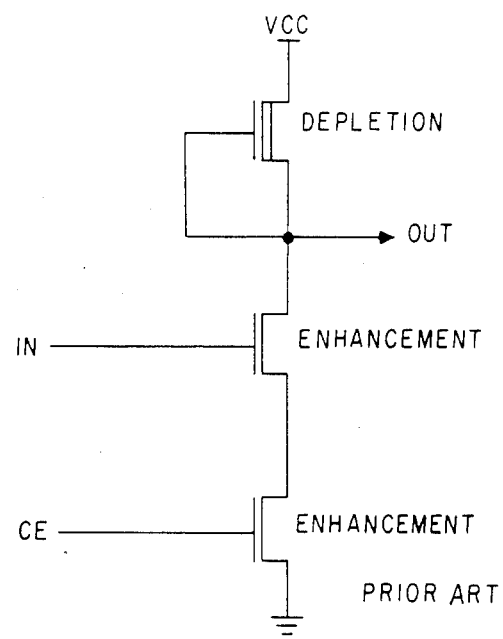
Figure 2A:
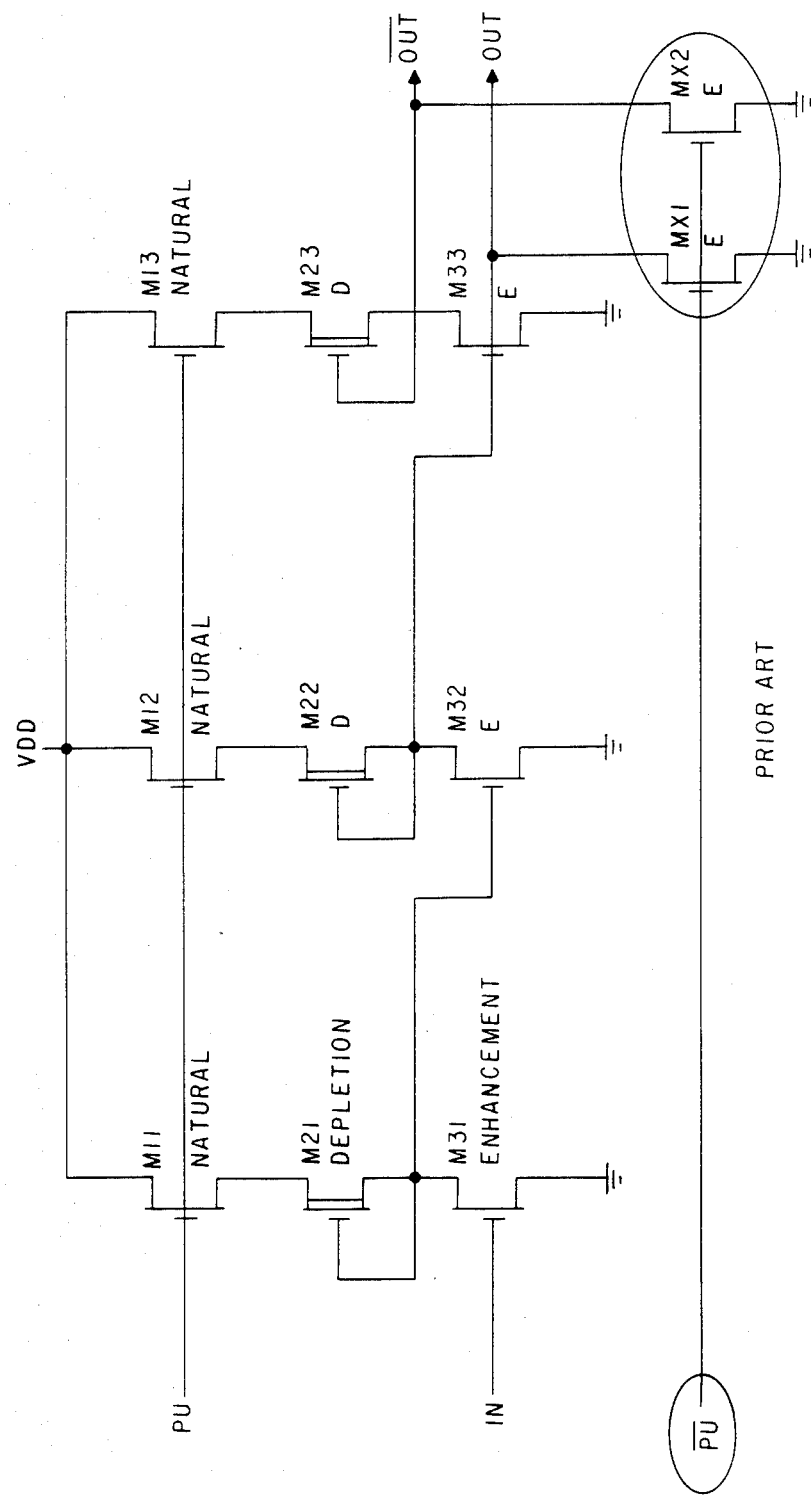
FIG. 2a shows a prior art buffer circuit with power-down capabilities.
Figure 2B:
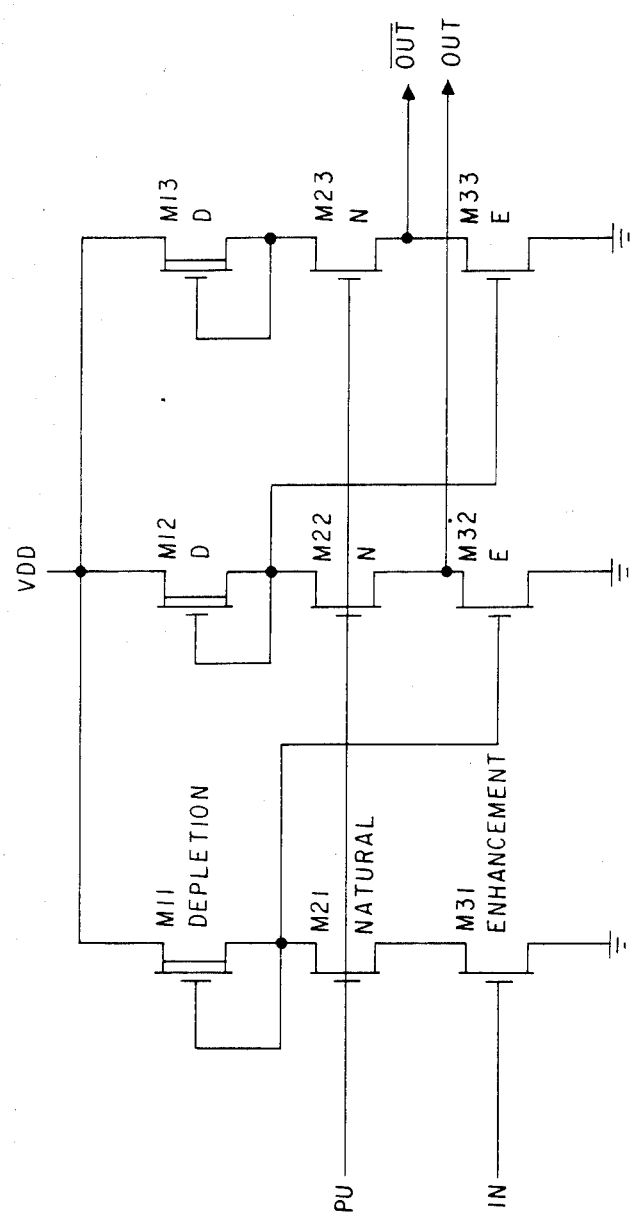
FIG. 2b shows a buffer circuit according to the present invention.

As shown in FIG. 1b, the proposed inverter with power-down feature is formed by three MOSFETS M1, M2, and M3. M1 is a depletion type device whose drain terminal is connected to the VDD power supply. The gate and source terminals of M1 are connected to the drain terminal of the Natural device M2 forming node N1. The Gate of this Natural device is controlled by the power-up signal PU. The source terminal of the Natural device and the drain terminal of Enhancement type device M3 are connected to form node N2. The source of M3 is connected to circuit ground (or VSS power supply), and the gate of this device is connected to the input signal IN. When the power-up signal PU is at a logic high level, the transistor M2 is fully turned on and thus in low impedance state. In this operating condition the nodes N1 and N2 are both in the complemented state of the input IN. Thus, either of the two nodes can be used as the inverted signal of the input during the power-up mode. However, when the input IN is high, this circuit dissipates power just as any other inverter configuration because now all of the three devices are turned on. On the other hand, when the PU signal is in logic zero state, the Natural device M2 is turned off. In this situation nodes N1 and N2 behave differently. Node N1 will go to a logic high level which can be considered as the complement of PU during the power-down mode (i.e., when PU signal is low). N2, however, depends on the input signal IN to a certain extent. N2 cannot make a transition from a logic low to a logic high since transistor M2 does not conduct during this mode of operation. Thus node N2 can be in any one of the three states as follows:

(1) N2 high/floating (high-Z) when IN low
(2) N2 low/floating (high-Z) when IN low or
(3) N2 low/active (low-Z) when IN high FIG. 2a shows a buffer circuit very widely used in present state-of-the-art static circuits. This circuit requires separate true and complemented PU signals. These signals generally have to be routed to various sections of the IC chip because usually only one external input signal is used to power-down the chip without disconnecting VDD supply. Also, additional transistors are required to guarantee a certain state at the outputs of this circuit. In the simple circuit of FIG. 2a, these requirements translate into PU and PU-bar signals as well as transistors MX1 and MX2. The same function can be obtained by using the inventive configuration as shown in FIG. 2b. In this configuration the PU-bar signal and the transistor corresponding to MX1 and MX2 are not needed. When this circuit is powered down, the outputs of the inverter stages at the nodes corresponding to N1 of FIG. 1b are used as locally generated PU-bar signals, and, since these nodes are functionally the same as N2 during power-up mode, the transistors whose gates are connected to the N1 nodes in this circuit serve a dual purpose (as signal inverters during the power-up mode, and as pull-down elements during power-down), whereas the conventional approach needed two extra devices because the PU and PU-bar are two physically different signal nodes.

The three transistors in the inverter of the present invention do not have to be the types mentioned. The Natural type device is used in the middle of the stack so that when node N2 is used as an output, its high voltage level will not suffer significantly from Vt drop. Otherwise an Enhancement type device can be used in its place just as well. Moreover the driver device does not necessarily have to be an Enhancement type. It can be a Natural or Depletion type depending upon the input signal levels. That is, in the presently preferred embodiment (using 3 V supply), the Natural device has threshold voltage of about 0.2 volts, and preferably in the range 0.1 to 0.3 volts, the Enhancement-mode device has a threshold voltage of 0.5 volts and preferably in the range of 0.4 to 0.6 volts and the depletion-mode device has a threshold voltage of preferably −1.5 volts, and is preferably in the range of −1.4 to −1.6 volts. Of course, a wide variety of other threshold voltages can be used, depending on the logic levels being designed for. (Normally, the Enhancement-mode threshold voltage will be selected to be intermediate between the logic levels used.)

It should be noted that the unique double-output capability of power-down inverter of the present invention is advantageously used in circuits such as that shown in FIG. 2b. That is, when the power-up line is low, the signal applied to the gate of transistor M32 will be high, and therefore the output line will be held at ground. Similarly, the signal applied to the gate at transistor M33 will also be high, so that the complementary output signal (the "OUT-bar" line) will also be held low. By contrast, in the prior art circuit of FIG. 2a, when the power-up and input signals are both low, the signal applied to the gate of transistor M32 will be indeterminate, and therefore the signals appearing on the output and out-bar lines would both be indeterminate, except that the addditional complementary power-out signal PU-bar is used to control additional transistors MX1 and MX2 to hold the output lines at ground during the power-down condition.

Figure 3:
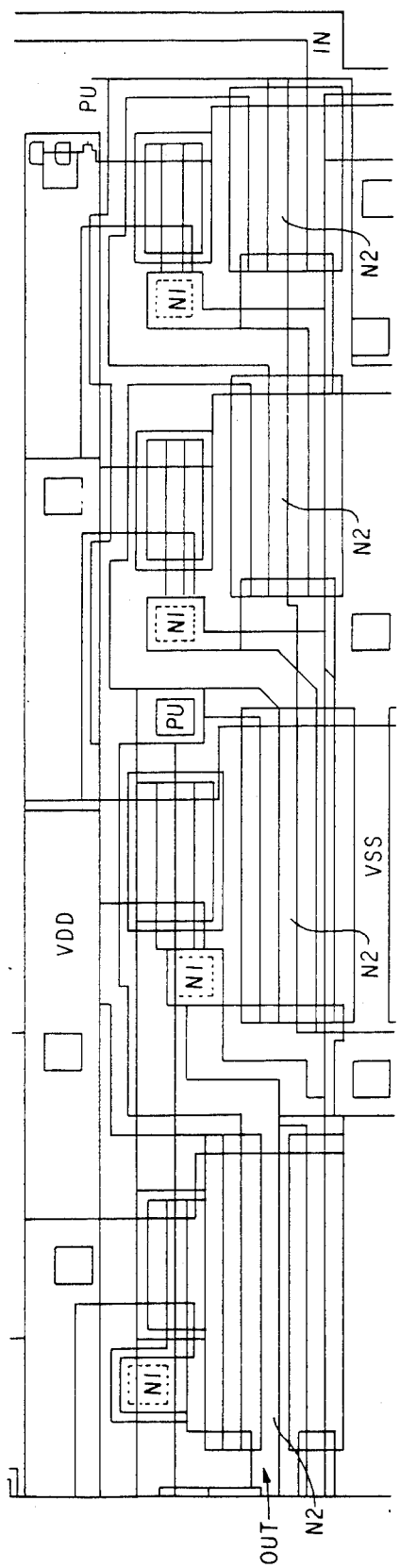
FIG. 3 shows a sample mask layout for a power-down static buffer according to the present invention.

FIG. 3 shows a sample mask configuration for realizing the buffer circuit of the present invention as shown in FIG. 2b. However, these particular embodiments are certainly not the only integrated circuit masking layouts in which the present invention can be configured.

The present invention is not applicable only to inverters and buffers, but also to any of the tremendous variety of logic circuits which incorporate inverters and/or buffers. Moreover, the present invention is also applicable to power-down implementations of other basic logic blocks, such as the two-input NAND gate of FIG. 4 and the two-input NOR of FIG. 5. In this case, the present invention teaches that more than one of the enhancement-mode devices are connected to pull down the second output node in accordance with a predetermined logical function of a plurality of inputs.

The threshold voltage of the power-up transistor is preferably small, but positive. The use of a low threshold voltage provides for a strong "on" state in the power-up device. (This criterion for power-up transistors is taught in U.S. Pat. No. 4,096,584 referenced above.) However, unlike this patent, the present invention teaches that the threshold voltage of the power-up device is greater than zero, to minimize current in the power-down mode. The use of a low-$V_T$ power-up device also permits very rapid powering-up of the circuit, which is highly desirable for fully asynchronous architectures, among other applications.

In fully asynchronous architectures the various circuits in the signal path on a chip are each powered up on the fly as they are needed. This means that rapid power-up capability is desirable to avoid slowing down the chip. However, power-down need not be as rapid, since this merely affects power dissipation slightly.

Thus, the "power-up" signal applied to the power-down transistor in the present invention need not be a chip-select signal. The circuit designer has a wide range of options for using circuits according to the present invention. However, wherever the chip designer chooses to bring a "power-up" signal from, the present invention provides a circuit which will dissipate no internal power when the power-up signal is low, and which will very rapidly return to a fully static function when the power-up signal goes high again.

The present invention has been described with reference to NMOS logic, to which it is peculiarly applicable. It would be possible to adapt the present invention to PMOS logic, or to other logic families using field-effect transistors, although no such adaptation appears immediately attractive. The present invention teaches that: a depletion load has its drain tied to one supply voltage, and its source provides a first output node; an input transistor has its source tied to a second supply voltage, and its drain provides a second output node; a power-up transistor is connected between the two output nodes; and preferably the threshold voltage of the power-up transistor is intermediate between the second supply voltage and the threshold voltage of the input transistors.

As it will appear obvious to those skilled in the art, the present invention can be realized in a wide variety of modifications and variations, and is not limited except as specified in accompanying claims.

What is claimed is:

1. A buffer circuit comprising:
   a power-up terminal for providing a power-up signal;
   an input terminal for providing an input signal;
   a power supply providing a first supply voltage;
   means providing a second supply voltage;
   first, second, and third inverters, each inverter comprising:
   first, second and third field effect transistors connected in series,
   said first transistor being a depletion mode transistor having a source, a drain, and a gate, the drain of said first transistor being connected to said power supply, and the source of said first transistor being connected to the gate,
   said second transistor being a power-down transistor having a source, a drain, and a gate, the drain of said second transistor being connected to the gate and the source of said first transistor, and
   said third transistor being an enhancement mode transistor having a source, a drain, and a gate, the drain of said third transistor being connected to the source of said second transistor, and the source of said third transistor being connected to said second supply voltage-providing means;
   the gate of said third transistor of said first inverter being connected to said input terminal for receiving an input signal therefrom;
   the gates of said second transistors of said first, second and third inverters being connected to said power-up terminal for receiving a power-up signal;
   said source of said first transistor of each of said first and second inverters providing respective first output nodes of said buffer circuit associated with said first and second inverters;
   said gate of said third transistor of said second inverter being connected to said first output node of said first inverter;
   said gate of said third transistor of said third inverter being connected to said first output node of said second inverter; and
   said source of said second transistor of each of said second and third inverters providing respective second output nodes of said buffer circuit from which complementary buffer output signals are provided.

2. A buffer circuit as set forth in claim 1, wherein said second supply voltage-providing means is ground.

3. A power-down logic circuit comprising:

a power-up terminal for providing a power-up signal;
first and second input terminals for respectively providing first and second input signals;
a power supply providing a first supply voltage;
means providing a second supply voltage;
a depletion mode first field effect transistor having a source, a drain, and a gate, the drain of said first transistor being connected to said power supply, and the source of said first transistor being connected to the gate, said source of said first transistor providing a first output node of said logic circuit;
a power-down second field effect transistor having a source, a drain, and a gate, the drain of said second transistor being connected to the gate and the source of said first transistor, the gate of said second transistor being connected to said power-up terminal for receiving a power-up signal, and the source of said second transistor providing a second output node of said logic circuit;
logic implementation means connected between said second output node and said second supply voltage-providing means and including at least a pair of enhancement mode field effect transistors having respective sources, drains, and gates;
the gates of said pair of transistors being respectively connected to said first and second input terminals for receiving first and second input signals, the drain-source current paths of said pair of transistors being connected in one of a series or parallel connection; and
said pair of transistors being connected to pull down said second output node in accordance with a predetermined logical function of said first and second input signals.

4. A power-down logic circuit as set forth in claim 3, wherein said second supply voltage-providing means is ground.

5. A power-down logic circuit as set forth in claim 4, wherein said pair of transistors included in said logic implementation means are connected in series between said second output node and ground to define a NAND gate circuit.

6. A power-down logic circuit as set forth in claim 4, wherein said pair of transistors included in said logic implementation means are connected in parallel between said second output node and ground to define a NOR gate circuit.

* * * * *